US012474725B2

(12) United States Patent
Liu et al.

(10) Patent No.: US 12,474,725 B2
(45) Date of Patent: Nov. 18, 2025

(54) ON-DEMAND FLOW RATE ADAPTER FOR FLOW RATE ADJUSTMENT IN LIQUID COOLING SOLUTIONS

(71) Applicant: Cisco Technology, Inc., San Jose, CA (US)

(72) Inventors: Chejung Liu, San Jose, CA (US); Vic Hong Chia, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 124 days.

(21) Appl. No.: 18/420,483

(22) Filed: Jan. 23, 2024

(65) Prior Publication Data

US 2025/0238046 A1     Jul. 24, 2025

(51) Int. Cl.
*G05D 23/02* (2006.01)
*H05K 7/20* (2006.01)

(52) U.S. Cl.
CPC ....... *G05D 23/023* (2013.01); *H05K 7/20272* (2013.01); *H05K 7/20281* (2013.01)

(58) Field of Classification Search
CPC ............ G05D 23/023; H05K 7/20272; H05K 7/20281
USPC ........................................................ 165/96
See application file for complete search history.

(56) References Cited

U.S. PATENT DOCUMENTS

| 4,621,594 | A | 11/1986 | Kubis |
| 6,427,967 | B1 | 8/2002 | Evans |
| 2010/0320410 | A1 | 12/2010 | Mogi et al. |
| 2012/0055565 | A1* | 3/2012 | Kanzaka ............ G05D 23/1333 137/468 |
| 2015/0212525 | A1 | 7/2015 | Bartha et al. |

(Continued)

FOREIGN PATENT DOCUMENTS

| EP | 1030040 A1 | 8/2000 |
| WO | 2014039639 A1 | 3/2014 |
| WO | 2016069313 A1 | 5/2016 |

OTHER PUBLICATIONS

Ma H-K., et al., "The Improved Performance of One-side Actuating Diaphragm Micropump for a Liquid Cooling System", International Communications in Heat and Mass Transfer, vol. 35, Oct. 2008, pp. 957-966.

(Continued)

*Primary Examiner* — Hai H Huynh
(74) *Attorney, Agent, or Firm* — Patterson + Sheridan, LLP (57) ABSTRACT

A flow rate adapter includes an enclosure defining an interior, a first partition separating the interior into first and second chambers, a second partition separating the interior into third and fourth chambers, and a flexible diaphragm separating the second and third chambers. Each chamber is fluidly isolated from one another. The second and third chambers are positioned between the first and fourth chambers with the second chamber being positioned adjacent to the first chamber and the third chamber being positioned adjacent to the fourth chamber. The second and third chambers are positioned adjacent to one another. The flow rate adapter includes a gate coupled with the flexible diaphragm. A temperature gradient between working fluid flowing through the first and fourth chambers causes the flexible diaphragm to flex, which moves the gate within the fourth chamber to control the flow rate of the working fluid.

20 Claims, 6 Drawing Sheets

(56) References Cited

U.S. PATENT DOCUMENTS

2019/0214329 A1 7/2019 Lan
2020/0141510 A1 5/2020 Qiu et al.

OTHER PUBLICATIONS

International Search Report and Written Opinion for International Application No. PCT/US2025/012581, mailed Mar. 24, 2025, 12 Pages.

* cited by examiner

ON-DEMAND FLOW RATE ADAPTER FOR FLOW RATE ADJUSTMENT IN LIQUID COOLING SOLUTIONS

TECHNICAL FIELD

Embodiments presented in this disclosure generally relate to a flow rate adapter. More specifically, embodiments presented herein relate to an on-demand flow rate adapter for flow rate adjustment in liquid cooling solutions.

BACKGROUND

Designing liquid cooling solutions that address the cooling requirements of Information Technology (IT) equipment based on their heat dissipation or thermal loads has presented certain challenges. Conventional solutions for controlling the flow rate of a liquid coolant based on the temperature of IT equipment have utilized complex feedback loops, additional control boards, sensors, motors, and other active-control equipment. Such conventional solutions can be expensive and subject to reliability issues.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a flow rate adapter. The flow rate adapter includes an enclosure defining an interior. The flow rate adapter also includes a first partition separating the interior of the enclosure into a first chamber and a second chamber. The first partition fluidly isolates the first and second chambers. In addition, the flow rate adapter includes a second partition further separating the interior of the enclosure into a third chamber and a fourth chamber. The second partition fluidly isolates the third and fourth chambers. Further, the flow rate adapter includes a flexible diaphragm separating, and fluidly isolating, the second and third chambers. The second and third chambers are positioned between the first and fourth chambers with the second chamber being positioned adjacent to the first chamber and the third chamber being positioned adjacent to the fourth chamber, and with the second and third chambers being positioned adjacent to one another. Also, the flow rate adapter includes a gate coupled with the flexible diaphragm and extending through the third chamber and at least in part into the fourth chamber. The gate is movable within the fourth chamber based at least in part on a temperature gradient between working fluid flowing through the first and fourth chambers.

Another embodiment presented in this disclosure is a system having at least one flow rate adapter. The system includes a cooling circuit along which flow rate adapters, a liquid-cooled system, and a cooling system are arranged. The cooling system has a distribution manifold. The liquid-cooled system has at least two heat source nodes having respective cold plates. Each one of the flow rate adapters includes an enclosure defining an interior; a first partition separating the interior of the enclosure into a first chamber and a second chamber, the first partition fluidly isolates the first and second chambers, the first chamber allows working fluid to flow from the distribution manifold to one of the respective cold plates; a second partition further separating the interior of the enclosure into a third chamber and a fourth chamber, the second partition fluidly isolates the third and fourth chambers, the fourth chamber allows working fluid to flow from one of the respective cold plates to the distribution manifold; a flexible diaphragm separating, and fluidly isolating, the second and third chambers, the second and third chambers are positioned between the first and fourth chambers with the second chamber being positioned in a heat exchange relationship with the first chamber and the third chamber being positioned in a heat exchange relationship with the fourth chamber, and with the second and third chambers being positioned adjacent to one another; and a gate coupled with the flexible diaphragm and extending through the third chamber and at least in part into the fourth chamber, the gate is movable within the fourth chamber based at least in part on a temperature gradient between working fluid flowing through the first and fourth chambers.

Another embodiment presented in this disclosure is a method. The method includes providing a cooling circuit along which a flow rate adapter, a liquid-cooled system, and a cooling system are arranged. The flow rate adapter includes: an enclosure defining an interior; a first partition separating the interior of the enclosure into a first chamber and a second chamber, the first partition fluidly isolates the first and second chambers, the first chamber allows working fluid to flow from the cooling system to the liquid-cooled system; a second partition further separating the interior of the enclosure into a third chamber and a fourth chamber, the second partition fluidly isolates the third and fourth chambers, the fourth chamber allows working fluid to flow from the liquid-cooled system to the cooling system; a flexible diaphragm separating, and fluidly isolating, the second and third chambers, the second and third chambers are positioned between the first and fourth chambers with the second chamber being positioned adjacent to the first chamber and the third chamber being positioned adjacent to the fourth chamber, and with the second and third chambers being positioned adjacent to one another; and a gate coupled with the flexible diaphragm and extending through the third chamber and at least in part into the fourth chamber, the gate is movable within the fourth chamber based at least in part on a temperature gradient between working fluid flowing through the first and fourth chambers. The method further includes flowing a working fluid along the cooling circuit so that a temperature gradient between the working fluid flowing through the first and fourth chambers causes the flexible diaphragm and gate coupled thereto to undergo dynamic movement until equilibrium is reached so as to control a flow rate of the working fluid flowing to and from the liquid-cooled system.

Example Embodiments

Liquid cooling of Information Technology (IT) equipment has become more common place due to the increasing power and power density of such IT equipment, which has increased the thermal loads thereof. Some liquid cooling solutions can be implemented to cool a combination of different IT equipment, such as servers, network switches, and routers, in a single rack. The different IT equipment of the single rack can have different power dissipation, and consequently, different cooling requirements. Conventional cooling solutions have been designed to produce a fixed liquid flow rate to all IT equipment in the single rack. However, with such designs, there can be variations in the flow rate to the IT equipment in the rack. This can lead to an insufficient flow rate or the need for excessive design adjustments. Some conventional cooling solutions have been implemented in an attempt to control the flow rate of a working fluid (e.g., a liquid coolant) based on the temperature of IT equipment, but such solutions have utilized complex feedback loops, additional control boards, sensors, motors, and other active-control equipment. Such conventional solutions can be expensive and subject to reliability issues.

Accordingly, the present disclosure provides an intelligent solution to help drive the on-demand cooling of IT equipment based on their power consumption, or rather, their thermal loads. Particularly, provided herein are various embodiments of a flow rate adapter. The flow rate adapter disclosed herein can advantageously function as a passive, on-demand flow rate regulator in a liquid cooling system. In at least some example aspects, each IT equipment or heat source node in a liquid cooling system can have an associated flow rate adapter that controls the flow rate of working fluid thereto and therefrom. In this way, such flow rate adapters can be implemented in a liquid cooling system, e.g., for cooling different IT equipment in a single rack.

In some aspects, a flow rate adapter in a liquid cooling system can control the flow rate of a working fluid flowing to and from its associated heat source node (or IT equipment) on demand by leveraging the temperature gradient of the working fluid flowing through different chambers of the flow rate adapter. Accordingly, the temperature gradient, which can change based on the thermal load of the heat source node fluidly coupled with the flow rate adapter, can act as the driving force to mechanically control a flexible diaphragm and gate of the flow rate adapter to control the flow rate of the working fluid to and from its associated heat source node. The working fluid flowing to each heat source node of a liquid cooling system can be controlled by respective flow rate adapters, allowing for automatic adjustment of the flow rate based on the thermal load of each heat source node.

The disclosed flow rate adapter can have certain associated benefits, advantages, and/or technical effects. For instance, one or more passive, on-demand flow rate adapters can be used to optimize the needed flow rate for their associated heat source nodes (or IT equipment), which allows for the working fluid to be fed to the heat source nodes from a manifold while also permitting mixed IT equipment to be included in a single rack—with the flow rate adapters controlling the flow rate to their respective heat source nodes based on their respective thermal loads. Moreover, by implementing the flow rate adapters into a liquid cooling system, improvements in pump efficiency can be achieved, which can result in power savings. In addition, the use of the flow rate adapters in a liquid cooling system can simplify the manifold design (e.g., a cold plate distribution manifold) as identical flow rate adapters can be utilized for each heat source node in the rack. Further, in some aspects, no electric power or active control is needed to control a flow rate adapter disclosed herein. Stated another way, the flow rate adapter of the present disclosure can be purely mechanical. In this regard, the flow rate adapter of the present disclosure can provide a cost-effective, reliable, and sustainable design. Moreover, the flow rate adapter of the present disclosure can be compatible with existing liquid cooling systems that are currently in operation. In addition, the modular design of the flow rate adapter facilitates easy installation and replacement, enhancing assembly efficiency. The disclosed flow rate adapters can have other benefits, advantages, and technical effects than those expressly noted. Example embodiments of flow rate adapters that can achieve one or more of the noted benefits, advantages, and/or technical effects are provided below.

Figure 1A:
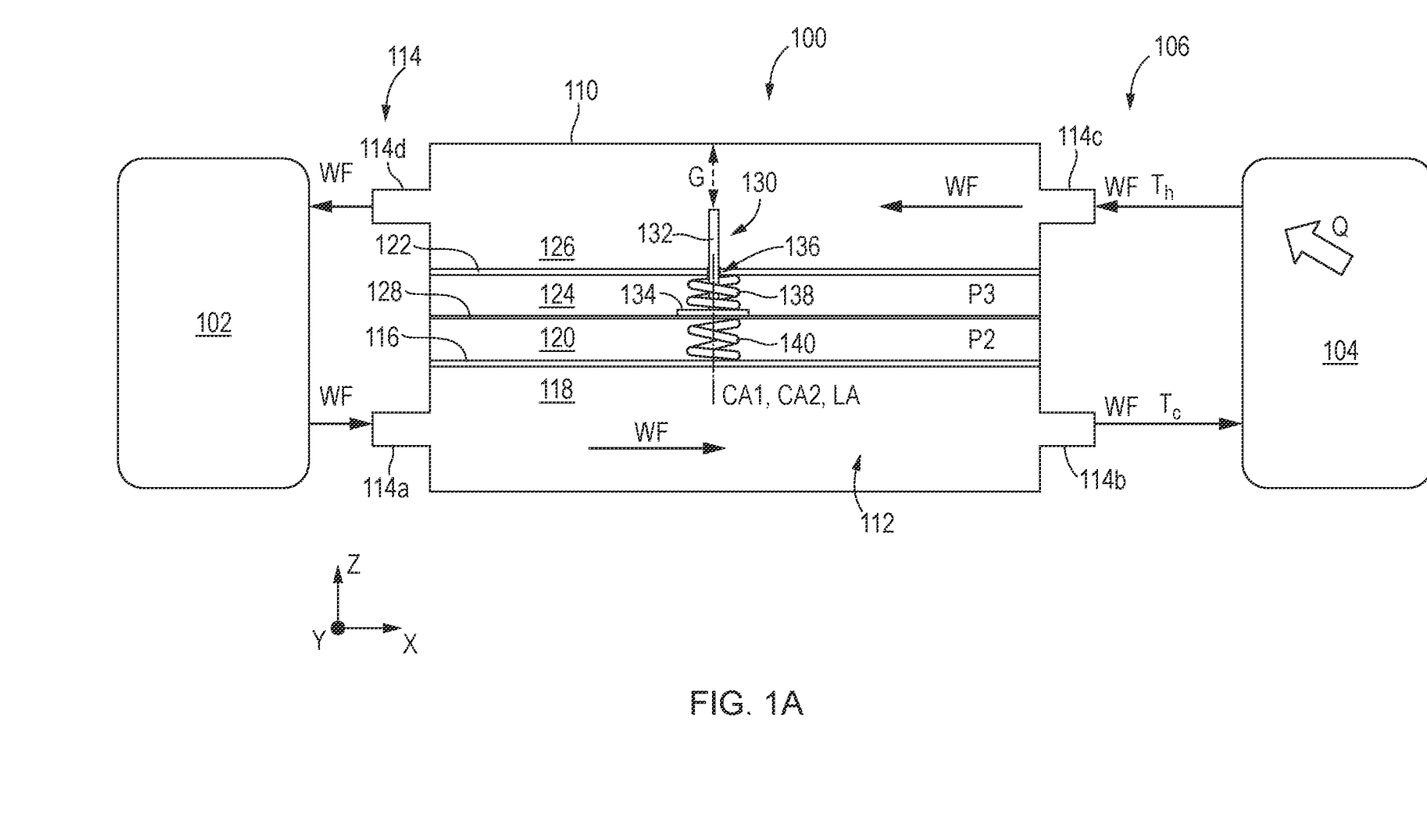
FIG. 1A is a schematic cross-sectional view of a flow rate adapter according to an example aspect of the present disclosure.

FIG. 1A is a schematic cross-sectional view of a flow rate adapter 100 according to an example aspect of the present disclosure. The flow rate adapter 100 can be arranged along a cooling circuit 106. A cooling system 102 and a liquid-cooled system 104 can also be arranged along the cooling circuit 106. For reference, a first direction X, a second direction Y, and a third direction Z are defined to provide an orthogonal direction system. The first direction X, the second direction Y, and the third direction Z are mutually perpendicular with one another.

The flow rate adapter 100 includes an enclosure 110 defining an interior 112 or internal volume. The enclosure 110 can be formed as a single unitary structure or can be modular and formed by a plurality of structures, such as by two complementary shells. For the depicted embodiment of FIG. 1A, the enclosure 110 has four ports (collectively ports 114), including a first port 114A, a second port 114B, a third port 114C, and a fourth port 114D. The ports 114 can each be quick disconnects, for example.

The interior 112 of the enclosure 110 is separated into a plurality of chambers. As illustrated in FIG. 1A, the flow rate adapter 100 includes a first partition 116 separating the interior 112 of the enclosure 110 into a first chamber 118 and a second chamber 120. The first partition 116 fluidly isolates the first and second chambers 118, 120. The first partition 116 has opposing ends that can be rigidly attached to the enclosure 110. At least two of the plurality of ports 114 are associated with the first chamber 118. In this example, the first chamber 118 is fluidly coupled with the first port 114A and the second port 114B. The first chamber 118 is arranged to receive a working fluid WF, which at this stage in the cooling circuit 106 is relatively cool. The relatively cool working fluid WF can be received from the cooling system 102, e.g., a distribution manifold thereof. The cooling system 102 functions to cool the working fluid. In some example aspects, the cooling system 102 can include, among other things, a Coolant Distribution Unit (CDU), Cold Plate Distribution Module (CDM), Quick Disconnects (QD), hoses, cold plates, cooling tower or chiller, etc. The relatively cool working fluid WF can enter the first chamber 118 via the first port 114A, can flow along the length of the first chamber 118 (e.g., generally along the first direction X in a left-to-right manner), and can then exit the first chamber 118 via the second port 114B. In this regard, in the example embodiment of FIG. 1A, the first port 114A is an inlet port while the second port 114B is an outlet port. The relatively cool working fluid WF can exit the second port 114B having a relatively cool temperature $T_C$. The relatively cool working fluid WF exiting the first chamber 118 can be routed to the liquid-cooled system 104, which can include a heat source node (e.g., an IT equipment) that is cooled with the working fluid via a cold plate. The second chamber 120 can be filled with a fluid, such as air or a liquid coolant.

A second partition 122 further separates the interior 112 of the enclosure 110 into a third chamber 124 and a fourth chamber 126. The second partition 122 fluidly isolates the third and fourth chambers 124, 126. The second partition 122 has opposing ends that can be rigidly attached to the enclosure 110. At least two of the plurality of ports 114 are associated with the fourth chamber 126. In this example, the fourth chamber 126 is fluidly coupled with the third port 114C and the fourth port 114D. The fourth chamber 126 is arranged to receive the working fluid WF, which at this stage in the cooling circuit 106 is relatively hot. The working fluid WF entering the fourth chamber 126 can have a relatively hot temperature $T_H$. Thermal energy or heat given off by the liquid-cooled system 104 can be imparted to the working fluid WF, as shown by the "Q" at the liquid-cooled system 104 in FIG. 1A. The volume of working fluid WF flowing through the fourth chamber 126 can be hot relative to the volume of working fluid WF flowing through the first chamber 118; accordingly, the "hot" and "cold" designations are relative and not intended to designate absolute temperatures of the working fluid WF. The relatively hot working fluid WF can enter the fourth chamber 126 via the third port 114C, can flow along the length of the fourth chamber 126 (e.g., generally along the first direction X in a right-to-left manner), and can then exit the fourth chamber 126 via the fourth port 114D. In this regard, in the example embodiment of FIG. 1A, the third port 114C is an inlet port while the fourth port 114D is an outlet port of the fourth chamber 126. The relatively hot working fluid WF exiting the fourth chamber 126 can be routed, e.g., back to the cooling system 102. In some example aspects, the working fluid flows through the first and fourth chambers 118, 126 in opposite directions, e.g., as shown in FIG. 1A. The third chamber 124 can be filled with a fluid, such as air or a liquid coolant. The fluid within the third chamber 124 can undergo pressure changes based on temperature fluctuations.

The flow rate adapter 100 also includes a flexible diaphragm 128 separating, and fluidly isolating, the second and third chambers 120, 124. The flexible diaphragm 128 is made of a flexible material, which allows the flexible diaphragm 128 to flex. The flexible diaphragm 128 has opposing ends that can be attached to the enclosure 110. The second and third chambers 120, 124 are positioned between the first and fourth chambers 118, 126, with the second chamber 120 being positioned adjacent to the first chamber 118 and the third chamber 124 being positioned adjacent to the fourth chamber 126. In this regard, the first chamber 118 and the second chamber 120 are arranged in a heat transfer relationship, e.g., a conductive heat transfer relationship. The fourth chamber 126 and the third chamber 124 are arranged in a heat transfer relationship, e.g., a conductive heat transfer relationship. Moreover, the second and third chambers 120, 124 are positioned adjacent to one another. As will be explained further below, the flexible diaphragm 128 can, until equilibrium is achieved, undergo dynamic movement due to the temperature gradient between the working fluid WF flowing through the first and fourth chambers 118, 126. The temperature gradient can cause the fluid within the second and third chambers 120, 124 to be at different pressures, which causes the flexible diaphragm 128 to "flex" toward the first chamber 118 or the fourth chamber 126.

Figure 1B:
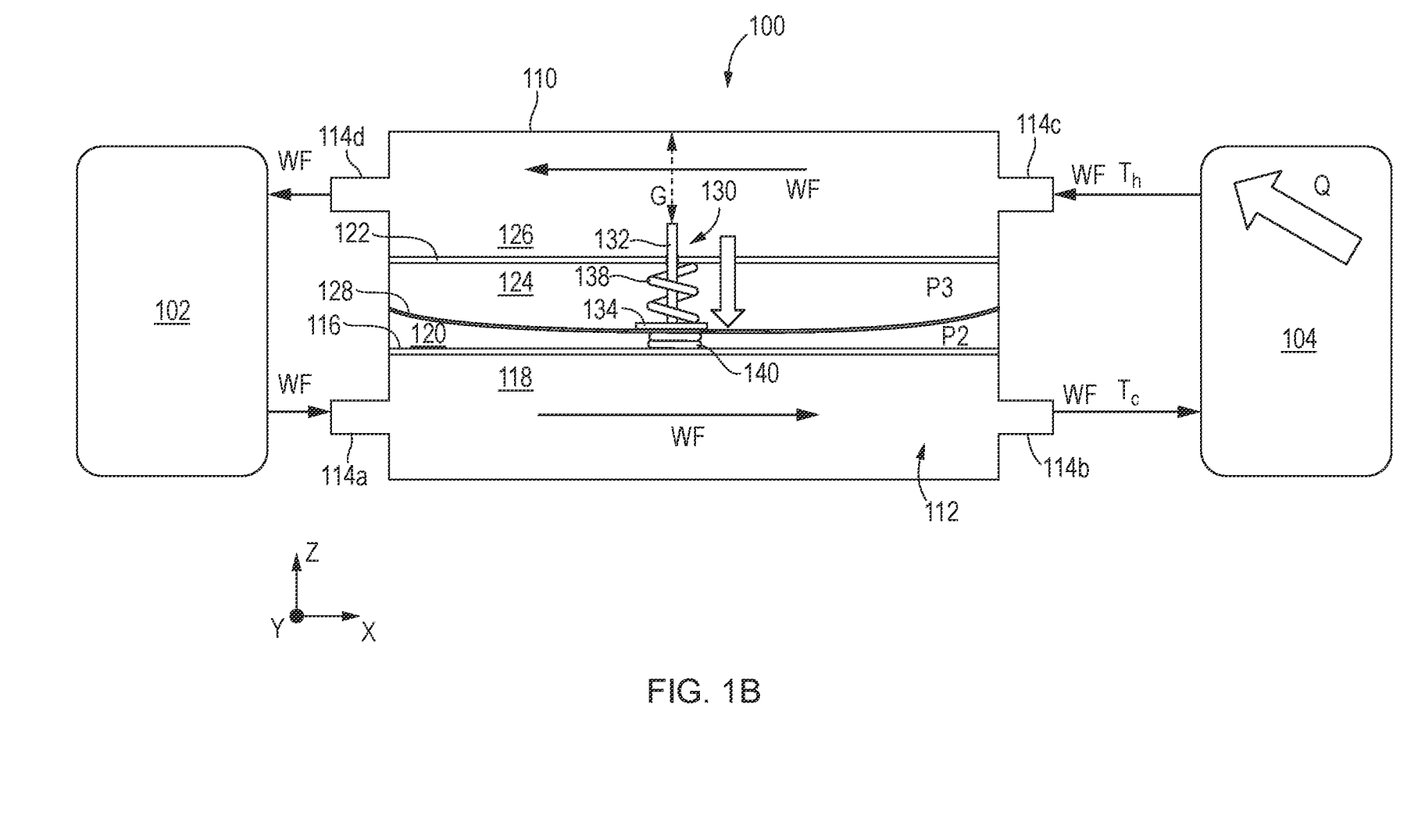
FIG. 1B is a schematic cross-sectional view of the flow rate adapter of FIG. 1A and depicts a gate thereof opened wider to increase a flow rate of working fluid flowing therethrough.
Figure 1C:
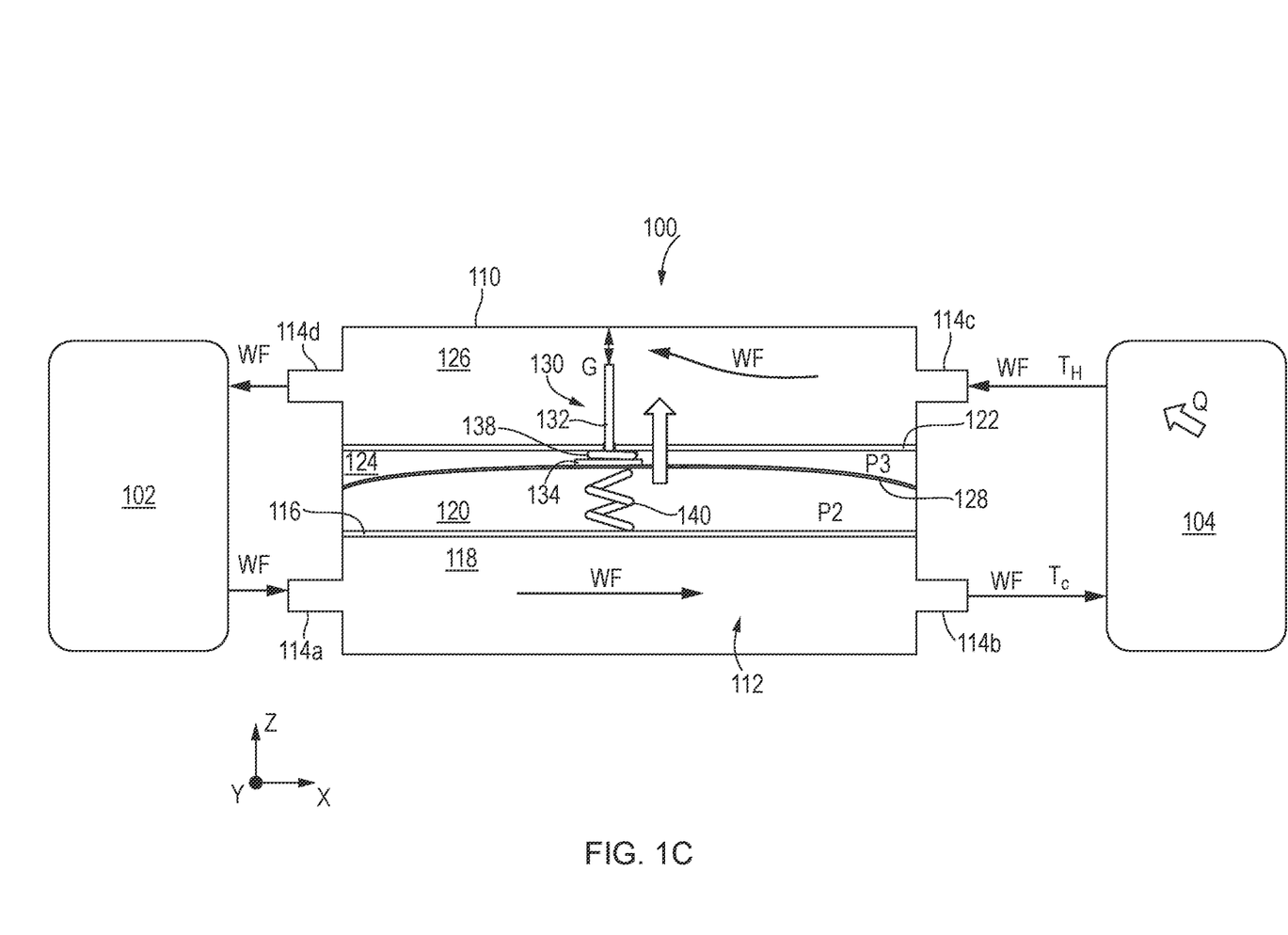
FIG. 1C is a schematic cross-sectional view of the flow rate adapter of FIG. 1A and depicts the gate thereof moved more closed to decrease the flow rate of working fluid flowing therethrough.

As further depicted in FIG. 1A, the flow rate adapter 100 includes a gate 130 coupled with the flexible diaphragm 128. The gate 130 can be coupled with the flexible diaphragm 128 via an adhesive attachment, for example. The gate 130 extends at least in part into the fourth chamber 126. The gate 130 is movable within the fourth chamber 126 based at least in part on the temperature gradient between the working fluid WF flowing through the first and fourth chambers 118, 126. That is, because the gate 130 is coupled with the flexible diaphragm 128, the gate 130 is movable along with the flexible diaphragm 128 based on the temperature gradient. Movement of the gate 130 within the fourth chamber 126 controls a flow rate of the working fluid through the fourth chamber 126, and consequently, the flow rate to and from the liquid-cooled system 104. The gate 130 can be moved within the fourth chamber 126, e.g., along the third direction Z, to adjust a gate opening or gap G. Generally, when the gap G is widened (e.g., as shown in FIG. 1B), the flow rate of the working fluid WF is increased. When the gap G is made less wide or more closed (e.g., as shown in FIG. 1C), the flow rate of the working fluid WF is decreased.

In the example embodiment of FIG. 1A, the gate 130 has a pin 132 and a platform 134 connected to the pin 132. The platform 134 is positioned in the third chamber 124 and the pin 132 is positioned at least in part in the third chamber 124 and at least in part in the fourth chamber 126. The pin 132 can extend from the platform 134 through a sealed orifice 136 defined by the second partition 122 and into the fourth chamber 126. The sealed orifice 136 can include an orifice defined by the second partition 122 and a seal arranged at the orifice. The flow rate adapter 100 of FIG. 1A also includes a first spring 138, or first biasing member, arranged within the third chamber 124 between the platform 134 and the second partition 122. The first spring 138 is arranged around the pin 132. The first spring 138 and the pin 132 function as a valve to control the gap G. The flow rate adapter 100 also includes a second spring 140, or second biasing member, arranged within the second chamber 120 between the flexible diaphragm 128 and the first partition 116. The second spring 138 functions to control the flexible diaphragm 128 at its initial or neutral position, which is shown in FIG. 1A. In some example aspects, a central axis CA1 of the first spring 138 and a central axis CA2 of the second spring 140 can be aligned coaxially with a long axis of the pin LA. The long axis LA of the pin extends along the third direction Z. Accordingly, the central axis CA1 of the first spring 138 and the central axis CA2 of the second spring 140 can also likewise extend along the third direction Z.

During operation, the flexible diaphragm 128 and the gate 130 coupled thereto can undergo dynamic movement due to the temperature gradient between the working fluid WF in the first and fourth chambers 118, 126. The temperature gradient can be defined as $T_H$-$T_C$, for example. The flexible diaphragm 128 and the gate 130 coupled thereto can undergo dynamic movement until equilibrium is achieved, e.g., until the pressure balance of the fluids within the second and third chambers 120, 124 and the spring forces reach equilibrium.

As one example, the heat source node of the liquid-cooled system 104 can be powered up, and as a result, the heat source node can give off heat. To provide cooling to the heat source node, a pump or other driving mechanism can circulate the working fluid WF along the cooling circuit 106. For instance, relatively cool working fluid WF can be directed from a distribution manifold of the cooling system 102 into the first chamber 118 of the flow rate adapter 100. The relatively cool working fluid WF can pass through the first chamber 118 and can flow to a cold plate associated with the heat source node of the liquid-cooled system 104. Heat can be imparted to the working fluid WF at the cold plate, as represented by the Q at the liquid-cooled system 104 in FIG. 1A. The heat imparted to the working fluid WF at the cold plate increases the temperature of the working fluid WF. The now relatively hot working fluid WF can be directed from the cold plate through the fourth chamber 126 of the flow rate adapter 100.

The working fluid WF entering the first chamber 118 can remain constant or substantially constant at a controlled temperature (e.g., 25° C.), while the elevated temperature at the inlet of the fourth chamber 126 (dependent on the heat source/load in the liquid-cooled system 104) serves as the driving force to flex the flexible diaphragm 128, which effectively adjusts the gate 130, which in turn adjusts the gap G. Particularly, heat from the working fluid WF in the fourth chamber 126 can be transferred to the fluid within the third chamber 124, which increases a pressure P3 of the fluid within the third chamber 124. When the pressure P3 of the fluid within the third chamber 124 is greater than a pressure P2 of the fluid within the second chamber 120 and great enough to overpower the spring forces of the first and second springs 138, 140, the flexible diaphragm 128 is pushed downward or flexed toward the first chamber 118, e.g., along the third direction Z. When the flexible diaphragm 128 is flexed toward the first chamber 118, the pin 132 of the gate 130 is also moved toward the first chamber 118, e.g., along the third direction Z. This causes the gap G to widen, which results in an increased flow rate of the working fluid WF.

When the pressures P2 and P3 of the fluids within the second and third chambers 120, 124 and the spring forces reach equilibrium, the flow rate of the working fluid WF can be maintained, e.g., to its optimum stage. If equilibrium is not reached or no longer reached, flow adjustment can continue by the dynamic movement of the flexible diaphragm 128 and the gate 130 coupled thereto. The temperature differential drives changes in the position of the flexible diaphragm 128 and gate 130 coupled thereto, which consequently affects the flow rate of the working fluid WF and overall cooling capacity to the liquid-cooled system 104.

Accordingly, when the liquid-cooled system 104 fluidly coupled with the flow rate adapter 100 is increasing its thermal loading, the working fluid within the fourth chamber 126 heats up relative to the working fluid WF within the first chamber 118. Heat transferred from the working fluid WF within the fourth chamber 126 to the fluid within the third chamber 124 causes the flexible diaphragm 128 to flex toward the first chamber 118 (and can ultimately reach equilibrium) as shown in FIG. 1B. The second spring 140 compresses and the first spring 138 is tensioned, and consequently, the pin 132 is moved downward (it retracts) to widen the gap G, which increases the flow rate of working fluid WF flowing through the fourth chamber 126. Thus, when the temperature gradient causes the flexible diaphragm 128 to flex toward the first chamber 118, e.g., as shown in FIG. 1B, the first spring 138 is in a tensioned state, the second spring 140 is in a compressed state, and the pin 132 is retracted so that less of the pin 132 is positioned within the fourth chamber 126 compared to a neutral position of the pin 132 when the flexible diaphragm 128 is in a neutral state. The flexible diaphragm 128 is shown in its neutral state in FIG. 1A. Therefore, the pin 132 is shown in FIG. 1A in its neutral position.

When the liquid-cooled system 104 fluidly coupled with the flow rate adapter 100 is decreasing its thermal loading and the flow rate is too fast through the fourth chamber 126, the flexible diaphragm 128 flexes toward the fourth chamber 126 (and can ultimately reach equilibrium) as shown in FIG. 1C. The first spring 138 compresses and the second spring 140 is tensioned, and consequently, the pin 132 is moved upward (e.g., along the third direction Z) to decrease the gap G, and consequently, the flow rate of working fluid WF flowing through the fourth chamber 126. Thus, when the temperature gradient causes the flexible diaphragm 128 to flex toward the fourth chamber 126, e.g., as shown in FIG. 1C, the first spring 138 is in a compressed state, the second spring 140 is in a tensioned state, and the pin 132 is moved further into the fourth chamber 126 compared to the neutral position of the pin 132 when the flexible diaphragm 128 is in its neutral state.

To summarize, when the temperature gradient drives the flexible diaphragm 128 to flex toward the first chamber 118, e.g., as shown in FIG. 1B, the pin 132 is retracted so that less of the pin 132 is positioned within the fourth chamber 126. That is, the gate 130 opens wider to increase the gap G, and as a result, the flow rate of the working fluid WF through the fourth chamber 126 is increased. In contrast, when the temperature gradient drives the flexible diaphragm 128 to flex toward the fourth chamber 126, e.g., as shown in FIG. 1C, the pin 132 is moved further into the fourth chamber 126. That is, the gate 130 moves more closed to decrease the gap G, and therefore, the flow rate of the working fluid WF through the fourth chamber 126 is decreased.

In some alternative embodiments, the flow rate adapter 100 of FIGS. 1A, 1B, and 1C can be configured without the first spring 138 and/or the second spring 140. An example embodiment is provided below.

Figure 2A:
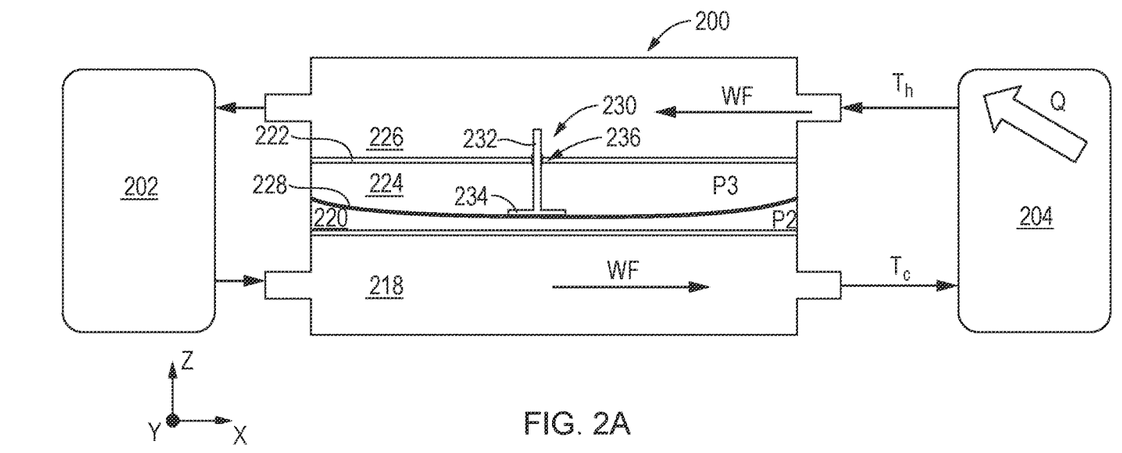
FIG. 2A is a schematic cross-sectional view of a flow rate adapter according to another example aspect of the present disclosure, and depicts a gate thereof opened wider to increase a flow rate of working fluid flowing therethrough.
Figure 2B:
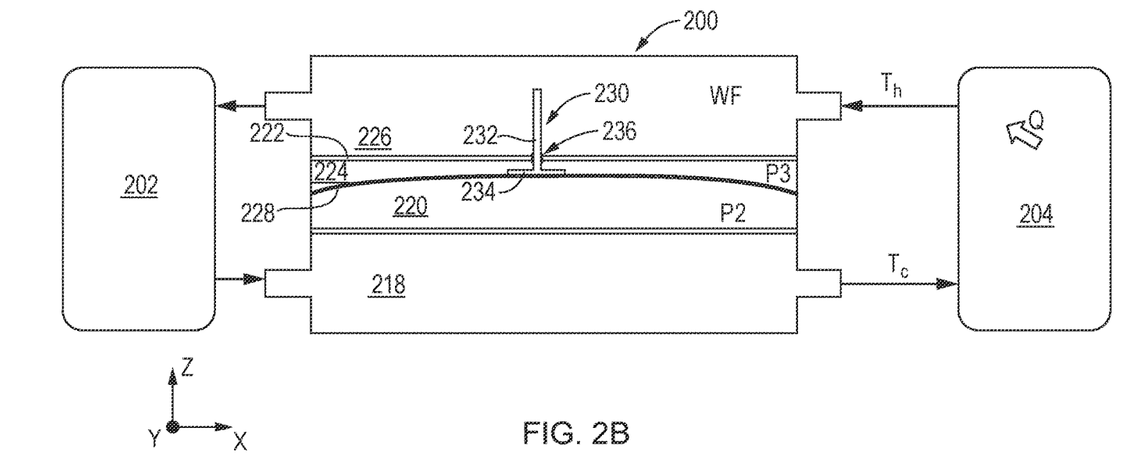
FIG. 2B is a schematic cross-sectional view of the flow rate adapter of FIG. 2B and depicts the gate thereof moved more closed to decrease the flow rate of working fluid flowing therethrough.

FIGS. 2A and 2B depict schematic cross-sectional views of a flow rate adapter 200 according to another example aspect of the present disclosure. The flow rate adapter 200 is configured in a similar manner as the flow rate adapter 100 of FIGS. 1A, 1B, and 1C, except as provided below. Similar reference numerals will be utilized to designate like parts except that in FIGS. 2A and 2B the numerals will be 200 series numerals rather than the 100 series numerals used in FIGS. 1A, 1B, and 1C.

As illustrated in FIGS. 2A and 2B, a gate 230 of the flow rate adapter 200 is coupled with a flexible diaphragm 228. The gate 230 includes a pin 232 and a platform 234 connected to the pin 232. The platform 234 is coupled with the flexible diaphragm 228. The platform 234 is positioned in a third chamber 224 and the pin 232 is positioned at least in part in the third chamber 224 and at least in part in a fourth chamber 226. The pin 232 can extend from the platform 234 through a sealed orifice 236 defined by a second partition 222 and into the fourth chamber 226. In this example embodiment, the flow rate adapter 200 is absent a spring arranged around the pin 232 (i.e., absent the first spring 138 depicted in FIGS. 1A, 1B, and 1C) and absent a spring positioned within a second chamber 220 (i.e., absent the second spring 140 depicted in FIGS. 1A, 1B, and 1C).

During operation, the flexible diaphragm 228 and the gate 230 coupled thereto undergo dynamic movement (until equilibrium is achieved) due to the temperature gradient of the working fluid WF between the first and fourth chambers 218, 226. As one example, the working fluid WF entering the first chamber 218 from a cooling system 202 can remain constant at a controlled temperature (e.g., 20° C.), while the elevated temperature at the outlet of the fourth chamber 226, with the elevated temperature being dependent on the heat source/load in the liquid-cooled system 204, serves as the driving force to flex the flexible diaphragm 228. In this regard, heat is transferred from the working fluid WF flowing through the fourth chamber 226 to the fluid within the third chamber 224, causing expansion and increased pressure of the fluid within the third chamber 224. Thus, the flexible diaphragm 228 flexes toward the first chamber 218. In FIG. 2A, the flexible diaphragm 228 has reached equilibrium (due to the pressures P2, P3 stabilizing) and has flexed toward to the first chamber 218. As a result, the gate 230 of the flow rate adapter 200 is opened wider to increase a flow rate of the working fluid flowing therethrough.

When the heat load of the liquid-cooled system decreases, or rather when the temperature differential decreases, less heat is transferred from the working fluid flowing through the fourth chamber 226 to the fluid within the third chamber 224, causing the pressure of the fluid within the third chamber 224 to decrease. Consequently, the flexible diaphragm 228 flexes less toward the first chamber 218, and in some instances, toward the fourth chamber 226. In FIG. 2B, the flexible diaphragm 228 has reached equilibrium and has flexed toward the fourth chamber 226. As a result, the gate 230 of the flow rate adapter 200 is moved more closed to decrease the flow rate of the working fluid flowing therethrough as shown in FIG. 2B.

Accordingly, the temperature gradient or differential initiates changes in position of the flexible diaphragm 228 and the gate 230 coupled thereto, namely by affecting the pressure differential between the fluid within the second chamber 220 and the fluid within the third chamber 224. In this way, for the embodiment of FIGS. 2A and 2B, the flexible diaphragm 228 and the gate 230 coupled thereto are moved based on a pressure differential or ratio between P3/P2 (or vice versa), e.g., without springs biasing the gate 230. The dynamic movement of the flexible diaphragm 228 and the gate 230 coupled thereto controls the flow rate and overall cooling capacity to/from the liquid-cooled system 204.

Figure 3:
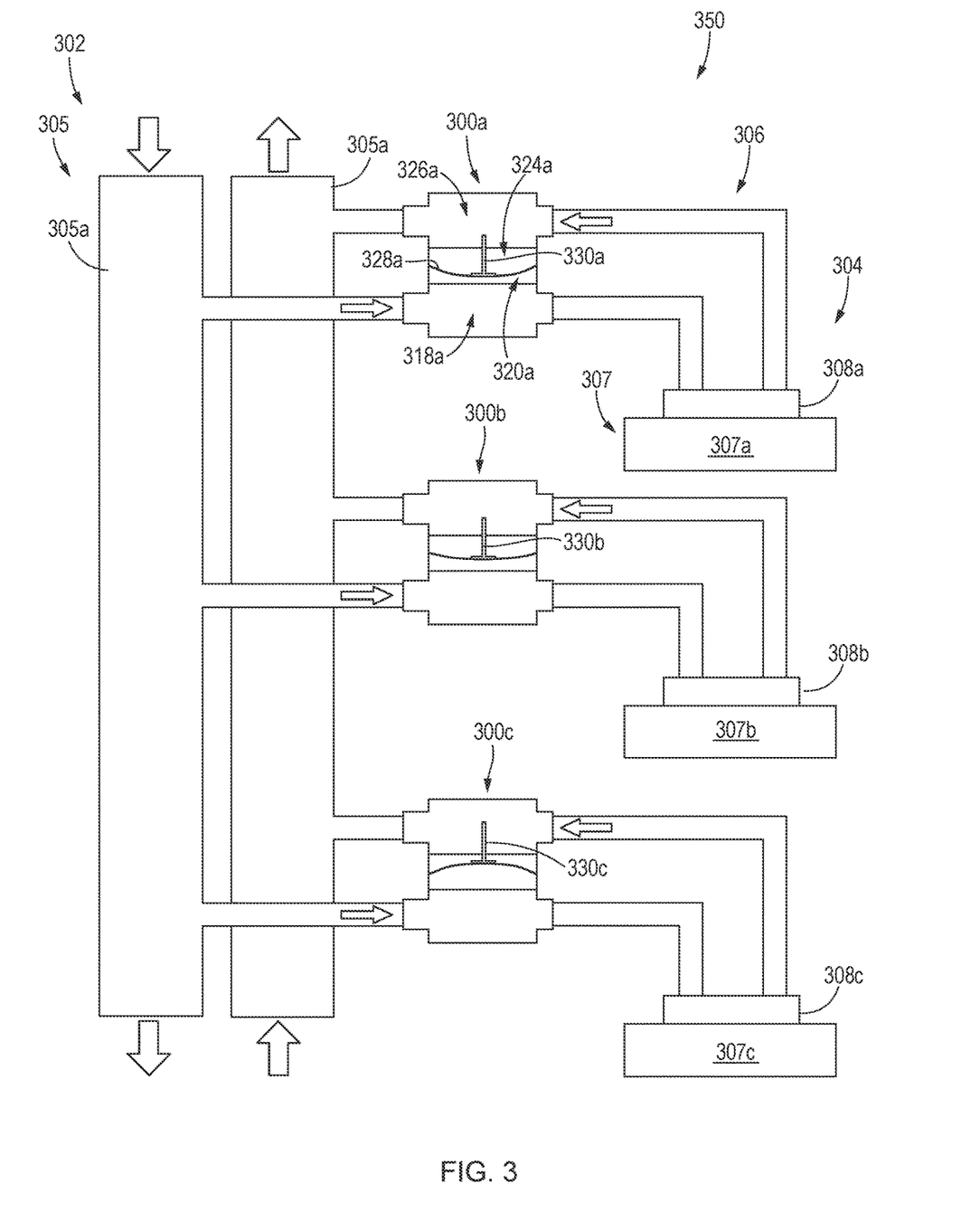
FIG. 3 is an example system having at least one flow rate adapter according to an example aspect of the present disclosure.

FIG. 3 is a schematic view of an example system 350 having at least one flow rate adapter according to an example aspect of the present disclosure. In the example depicted in FIG. 3, the system 350 has three (3) flow rate adapters 300A, 300B, 300C, but in other examples, the system 350 can have more or less than three (3) flow rate adapters. The flow rate adapters 300A, 300B, 300C can be respectively configured as the flow rate adapter 100 of FIGS. 1A, 1B, and 1C or the flow rate adapter 200 of FIGS. 2A and 2B, for example. In this regard, FIG. 3 illustrates one example system in which the flow rate adapters 100, 200 can be implemented.

As shown in FIG. 3, the system 350 includes a cooling circuit 306 along which the flow rate adapters 300A, 300B, 300C, a liquid-cooled system 304, and a cooling system 302 are arranged. Other components and/or system can be arranged along the cooling circuit 306 as well, such as one or more pumps. The cooling system 302 has, among other things, a CDM 305. The CDM 305 includes a supply manifold 305A and a return manifold 305B. The supply manifold 305A is configured to supply relatively cool working fluid, e.g., to respective heat source nodes of the liquid-cooled system 304. The return manifold 305B is configured to return relatively hot working fluid (which has been heated by the heat source nodes) to a downstream system, such as a cooling tower or chiller. The downstream system can cool the working fluid, and the cooled working fluid can then be directed along the supply manifold 305A for cooling the heat source nodes. Although the cooling circuit 306 has been described as a closed-loop system, the flow rate adapters 300A, 300B, 300C can also be implemented in open-loop systems.

The liquid-cooled system 304 has a plurality of heat source nodes 307, including heat source nodes 307A, 307B, 307C. Each heat source node 307A, 307B, 307C has a respective cold plate 308A, 308B, 308C. The cold plates 308A, 308B, 308C are heat sinks that can have integrated flow channels that allow the working fluid to flow therethrough to dissipate heat given off by their respective heat source nodes 307A, 307B, 307C. The heat source nodes 307 can include a combination of different IT equipment, such as servers, network switches, and routers, which can be arranged in a single rack. In some example aspects, at least two heat source nodes 307 can have different power dissipation, and consequently, different cooling requirements.

The flow rate adapter 300A can include an enclosure defining an interior. The flow rate adapter 300A can also include a first partition separating the interior of the enclosure into a first chamber 318A and a second chamber 320A. The first partition fluidly isolates the first and second chambers 318A, 320A. The first chamber 318A allows working fluid to flow from the CDM 305, or supply manifold 305A thereof, to the cold plate 308A associated with the heat source node 307A. Heat dissipated by the heat source node 307A can impart thermal energy or heat to the working fluid flowing through the cold plate 308A. The flow rate adapter 300A also includes a second partition further separating the interior of the enclosure into a third chamber 324A and a fourth chamber 326A. The second partition fluidly isolates the third and fourth chambers 324A, 326A. The fourth chamber 326A allows working fluid to flow from the cold plate 308A associated with the heat source node 307A to the CDM 305, or return manifold 305B thereof. In this regard, the heat dissipated from the heat source node 307A can be carried away by the working fluid. The flow rate adapter 300A further includes a flexible diaphragm 328A separating, and fluidly isolating, the second and third chambers 320A, 324A. The second and third chambers 320A, 324A are positioned between the first and fourth chambers 318A, 326A with the second chamber 320A being positioned in a heat exchange relationship (e.g., a conductive heat transfer relationship) with the first chamber 318A and the third chamber 324A being positioned in a heat exchange relationship (e.g., a conductive heat transfer relationship) with the fourth chamber 326A. The second and third chambers 320A, 324A are positioned adjacent to one another. The flow rate adapter 300A also includes a gate 330A coupled with the flexible diaphragm 328A and extending at least in part into the fourth chamber 326A. The gate 330A is movable within the fourth chamber 326A based at least in part on a temperature gradient between working fluid flowing through the first and fourth chambers 318A, 326A.

The flow rate adapter 300A helps drive the on-demand cooling of the heat source node 307A based on the power consumption specific to the heat source node 307A. Stated differently, the flow rate adapter 300A controls the flow rate of the working fluid to/from the heat source node 307A by leveraging the temperature gradient of the working fluid (e.g., liquid coolant) to effectively manage the flow capacity of the system in relation to the power loading of the heat source node 307A. The flow rate adapters 300B and 300C can be configured in a similar manner as the flow rate adapter 300A and can thus control the flow rate of the working fluid to/from their respective heat source nodes 307B, 307C by leveraging the temperature gradient of the working fluid within their respective first and fourth chambers, which effectively manages the flow capacity of the system in relation to the power loading of their respective heat source nodes 307B, 307C.

By implementing the system 350, improvements in pump efficiency can be achieved, resulting in considerable power savings. Moreover, the use of the flow rate adapters 300A, 300B, 300C can simplify the manifold design (e.g., the design of CDM 305) as identical couplers or adapters can be utilized. In addition, the passive, on-demand flow adapters 300A, 300B, 300C can optimize the needed flow rate for each heat source node 307, despite different heat dissipation rates of the heat source nodes 307. For instance, as shown in FIG. 3, the gates 330A, 330B, 330C are provided at different locations within their respective flow rate adapters 300A, 300B, 300C based on the temperature gradients of the working fluid within their receptive first and fourth chambers, which provides for different and tailored working fluid flow rates, even despite being fed working fluid from a common manifold. These features advantageously permit mixed IT equipment to be placed in a single rack, among other benefits.

Figure 4:
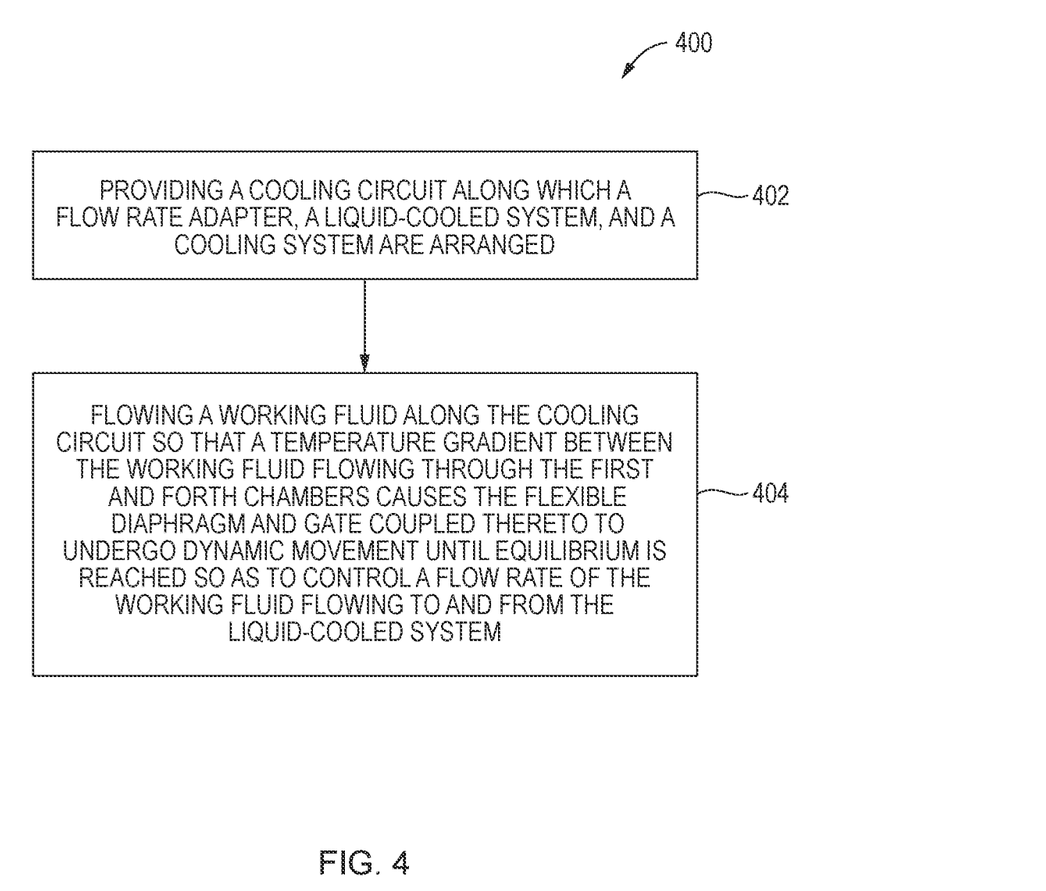
FIG. 4 is a flow diagram for a method according to an example aspect of the present disclosure.

FIG. 4 is a flow diagram for a method 400 according to an example aspect of the present disclosure.

At 402, the method 400 can include providing a cooling circuit along which a flow rate adapter, a liquid-cooled system, and a cooling system are arranged. The flow rate adapter can be configured in the same or similar manner as any of the flow rate adapters described herein. In some example implementations, the flow rate adapter can include an enclosure defining an interior. The flow rate adapter can also include a first partition separating the interior of the enclosure into a first chamber and a second chamber. The first partition fluidly isolates the first and second chambers. The first chamber allows working fluid to flow from the cooling system to the liquid-cooled system. The flow rate adapter can further include a second partition further separating the interior of the enclosure into a third chamber and a fourth chamber. The second partition fluidly isolates the third and fourth chambers. The fourth chamber allows working fluid to flow from the liquid-cooled system to the cooling system. In addition, the flow rate adapter can include a flexible diaphragm separating, and fluidly isolating, the second and third chambers. The second and third chambers are positioned between the first and fourth chambers with the second chamber being positioned adjacent to the first chamber and the third chamber being positioned adjacent to the fourth chamber, and with the second and third chambers being positioned adjacent to one another. Further, the flow rate adapter can include a gate coupled with the flexible diaphragm. The gate can extend at least in part into the fourth chamber. The gate is movable within the fourth chamber based at least in part on a temperature gradient between working fluid flowing through the first and fourth chambers.

At 404, the method 400 can include flowing a working fluid along the cooling circuit so that a temperature gradient between the working fluid flowing through the first and fourth chambers causes the flexible diaphragm and gate coupled thereto to undergo dynamic movement until equilibrium is reached so as to control a flow rate of the working fluid flowing to and from the liquid-cooled system.

In some example implementations, a working fluid, which has been cooled by the cooling system, can flow through the first chamber of the flow rate adapter and to the liquid-cooled system. Thermal energy or heat emitted by the liquid-cooled system can be imparted to the working fluid. The heated working fluid can then flow through the fourth chamber. Thermal energy or heat from the working fluid flowing through the fourth chamber can be imparted to the fluid within the third chamber, causing the fluid within the third chamber to expand and thus increase in pressure. The increased pressure of the fluid within the third chamber forces the flexible diaphragm and gate coupled thereto to move or flex toward the first chamber, e.g., as shown in FIGS. 1B and 2A, which effectively widens the gap and increases the flow rate of the working fluid to/from the liquid-cooled system. The flexible diaphragm and gate coupled thereto can move dynamically until the pressure of the fluid within the third chamber and the pressure of the fluid within the second chamber (and the spring forces, if applicable) reach equilibrium. When equilibrium is no longer reached, the flexible diaphragm and gate coupled thereto can move dynamically once again to provide on-demand adjustment of the flow rate based on the power dissipation or thermal load of the liquid-cooled system.

When the thermal load of the liquid-cooled system is decreasing, the thermal gradient can cause the pressure of the fluid within the second chamber to be greater than the pressure of the fluid within the third chamber, and as a result, the flexible diaphragm and gate coupled thereto can be moved or flexed toward the fourth chamber, e.g., as shown in FIGS. 1C and 2B, which effectively closes the gap and decreases the flow rate of the working fluid to/from the liquid-cooled system. The flexible diaphragm and gate coupled thereto can move dynamically until the pressure of the fluid within the second chamber and the pressure of the fluid within the third chamber (and the spring forces, if applicable) reach equilibrium.

In some further implementations, the liquid-cooled system can include a plurality of heat source nodes having respective cold plates. The heat source nodes can includes at least two different IT equipment having different power dissipation or thermal loads. The heat source nodes can be arranged in a single rack, for example. The cooling system can have a distribution manifold. The flow rate adapter can be one of a plurality of flow rate adapters arranged along the cooling circuit between the distribution manifold and respective cold plates, e.g., as shown in FIG. 3. The flow rate adapters can control the working fluid to and from their respective heat source nodes (or cold plates thereof) on demand and according to the thermal loads of their respective heat source nodes.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s).

In view of the foregoing, the scope of the present disclosure is determined by the claims that follow.

We claim:

1. A flow rate adapter, comprising:
    an enclosure defining an interior;
    a first partition separating the interior of the enclosure into a first chamber and a second chamber, the first partition fluidly isolates the first and second chambers;
    a second partition further separating the interior of the enclosure into a third chamber and a fourth chamber, the second partition fluidly isolates the third and fourth chambers;
    a flexible diaphragm separating, and fluidly isolating, the second and third chambers, the second and third chambers are positioned between the first and fourth chambers with the second chamber being positioned adjacent to the first chamber and the third chamber being positioned adjacent to the fourth chamber, and with the second and third chambers being positioned adjacent to one another; and
    a gate coupled with the flexible diaphragm and extending through the third chamber and at least in part into the fourth chamber, the gate is movable within the fourth chamber based at least in part on a temperature gradient between working fluid flowing through the first and fourth chambers.

2. The flow rate adapter of claim 1, wherein movement of the gate within the fourth chamber controls a flow rate of working fluid through the fourth chamber.

3. The flow rate adapter of claim 1, wherein the gate has a pin and a platform connected to the pin, and wherein the flow rate adapter further comprises:
    a first spring arranged within the third chamber between the platform and the second partition, the first spring is arranged around the pin.

4. The flow rate adapter of claim 3, further comprising:
    a second spring arranged within the second chamber between the flexible diaphragm and the first partition.

5. The flow rate adapter of claim 4, wherein when the temperature gradient causes the flexible diaphragm to flex toward the first chamber, the first spring is in a tensioned state, the second spring is in a compressed state, and the pin is retracted so that less of the pin is positioned within the fourth chamber, compared to a neutral position of the pin when the flexible diaphragm is in a neutral state.

6. The flow rate adapter of claim 4, wherein when the temperature gradient causes the flexible diaphragm to flex toward the fourth chamber, the first spring is in a compressed state, the second spring is in a tensioned state, and the pin is moved further into the fourth chamber, compared to a neutral position of the pin when the flexible diaphragm is in a neutral state.

7. The flow rate adapter of claim 4, wherein a central axis of the first spring and a central axis of the second spring are aligned coaxially with a long axis of the pin.

8. The flow rate adapter of claim 1, wherein the gate has a pin and a platform connected to the pin, and wherein the platform is positioned in the third chamber and the pin extends from the platform through a sealed orifice defined by the second partition and into the fourth chamber.

9. The flow rate adapter of claim 8, wherein when the temperature gradient causes the flexible diaphragm to flex toward the first chamber, the pin is retracted so that less of the pin is positioned within the fourth chamber.

10. The flow rate adapter of claim 8, wherein when the temperature gradient causes the flexible diaphragm to flex toward the fourth chamber, the pin is moved further into the fourth chamber.

11. The flow rate adapter of claim 1, wherein the enclosure has a plurality of ports, with at least two of the plurality of ports being associated with the first chamber and at least two of the plurality of ports being associated with the fourth chamber.

12. The flow rate adapter of claim 1, wherein an inlet port of the first chamber is fluidly coupled with a distribution module and an outlet port of the first chamber is fluidly coupled with a liquid-cooled system, and wherein an inlet port of the fourth chamber is fluidly coupled with the liquid-cooled system and an outlet port of the fourth chamber is fluidly coupled with the distribution module.

13. The flow rate adapter of claim 1, wherein the working fluid flows through the first and fourth chambers in opposite directions.

14. The flow rate adapter of claim 1, wherein the gate is moved based on a pressure differential between fluid within the second chamber and fluid within the third chamber without springs biasing the gate.

15. A system, comprising:
    a cooling circuit along which flow rate adapters, a liquid-cooled system, and a cooling system are arranged,
    the cooling system has a distribution manifold,
    the liquid-cooled system has at least two heat source nodes having respective cold plates,
    each one of the flow rate adapters comprises:
        an enclosure defining an interior;
        a first partition separating the interior of the enclosure into a first chamber and a second chamber, the first partition fluidly isolates the first and second chambers, the first chamber allows working fluid to flow from the distribution manifold to one of the respective cold plates;
        a second partition further separating the interior of the enclosure into a third chamber and a fourth chamber, the second partition fluidly isolates the third and fourth chambers, the fourth chamber allows working fluid to flow from one of the respective cold plates to the distribution manifold;
        a flexible diaphragm separating, and fluidly isolating, the second and third chambers, the second and third chambers are positioned between the first and fourth chambers with the second chamber being positioned in a heat exchange relationship with the first chamber and the third chamber being positioned in a heat exchange relationship with the fourth chamber, and with the second and third chambers being positioned adjacent to one another; and
        a gate coupled with the flexible diaphragm and extending through the third chamber and at least in part into the fourth chamber, the gate is movable within the fourth chamber based at least in part on a temperature gradient between working fluid flowing through the first and fourth chambers.

16. The system of claim 15, wherein each one of the at least two heat source nodes are associated with a respective one of the flow rate adapters.

17. The system of claim 15, wherein at least one of the flow rate adapters is configured such that the gate has a pin and a platform connected to the pin, and wherein the at least one flow rate adapter further comprises:
- a first spring arranged within the third chamber between the platform and the second partition, the first spring is arranged around the pin; and
- a second spring arranged within the second chamber between the flexible diaphragm and the first partition.

18. The system of claim 15, wherein at least one of the flow rate adapters is configured such that the gate has a pin and a platform connected to the pin, and wherein the platform is positioned in the third chamber and the pin extends from the platform through a sealed orifice defined by the second partition and into the fourth chamber, and
- wherein the temperature gradient causes the flexible diaphragm to flex toward the first chamber, the pin is retracted so that less of the pin is positioned within the fourth chamber, and
- wherein when the temperature gradient causes the flexible diaphragm to flex toward the fourth chamber, the pin is moved further into the fourth chamber.

19. The system of claim 15, wherein the at least two heat source nodes are different information technology equipment having different thermal loads.

20. A method, comprising:
- providing a cooling circuit along which a flow rate adapter, a liquid-cooled system, and a cooling system are arranged, the flow rate adapter comprises:
  - an enclosure defining an interior;
  - a first partition separating the interior of the enclosure into a first chamber and a second chamber, the first partition fluidly isolates the first and second chambers, the first chamber allows working fluid to flow from the cooling system to the liquid-cooled system;
  - a second partition further separating the interior of the enclosure into a third chamber and a fourth chamber, the second partition fluidly isolates the third and fourth chambers, the fourth chamber allows working fluid to flow from the liquid-cooled system to the cooling system;
  - a flexible diaphragm separating, and fluidly isolating, the second and third chambers, the second and third chambers are positioned between the first and fourth chambers with the second chamber being positioned adjacent to the first chamber and the third chamber being positioned adjacent to the fourth chamber, and with the second and third chambers being positioned adjacent to one another; and
  - a gate coupled with the flexible diaphragm and extending through the third chamber and at least in part into the fourth chamber, the gate is movable within the fourth chamber based at least in part on a temperature gradient between working fluid flowing through the first and fourth chambers; and
- flowing a working fluid along the cooling circuit so that a temperature gradient between the working fluid flowing through the first and fourth chambers causes the flexible diaphragm and gate coupled thereto to undergo dynamic movement until equilibrium is reached so as to control a flow rate of the working fluid flowing to and from the liquid-cooled system.

\* \* \* \* \*